US009699899B2

(12) United States Patent
Ullmann et al.

(10) Patent No.: US 9,699,899 B2
(45) Date of Patent: Jul. 4, 2017

(54) PLASTIC FILM HAVING LINES FOR A MULTI-MODAL INPUT DEVICE AND METHOD FOR PRODUCING

(75) Inventors: Andreas Ullmann, Zirndorf (DE); Andrey Alekseev, Furth (DE); Walter Fix, Furth (DE)

(73) Assignee: PolyIC GmbH & Co. KG, Furth (DE)

( * ) Notice: Subject to any disclaimer, the term of this patent is extended or adjusted under 35 U.S.C. 154(b) by 253 days.

(21) Appl. No.: 14/235,472

(22) PCT Filed: Jul. 23, 2012

(86) PCT No.: PCT/EP2012/064418
§ 371 (c)(1),
(2), (4) Date: Mar. 21, 2014

(87) PCT Pub. No.: WO2013/017460
PCT Pub. Date: Feb. 7, 2013

(65) Prior Publication Data
US 2014/0238728 A1 Aug. 28, 2014

(30) Foreign Application Priority Data
Jul. 29, 2011 (DE) .................. 10 2011 108 803

(51) Int. Cl.
*G06F 3/044* (2006.01)
*H05K 1/11* (2006.01)
(Continued)

(52) U.S. Cl.
CPC ............... *H05K 1/11* (2013.01); *G06F 3/044* (2013.01); *H05K 3/32* (2013.01);
(Continued)

(58) Field of Classification Search
CPC .......... H05K 1/11; H05K 3/32; H05K 1/0274; G06F 3/047; G06F 3/044; Y10T 29/4913
See application file for complete search history.

(56) References Cited

U.S. PATENT DOCUMENTS

| 4,304,976 A | 12/1981 | Gottbreht et al. |
| 4,659,874 A | 4/1987 | Landmeier |
| (Continued) | | |

FOREIGN PATENT DOCUMENTS

| CN | 101794187 A | 8/2010 |
| DE | 2910451 A1 | 9/1979 |
| (Continued) | | |

OTHER PUBLICATIONS

EPO International Search Report Oct. 16, 2012 cited in PCT application corresponding to instant subject applicatoin with written opinion.

*Primary Examiner* — Ibrahim Khan
(74) *Attorney, Agent, or Firm* — William Squire

(57) ABSTRACT

A plastic film for a multi-modal input device has conductors that link a touch module and an operating element. Such input devices, for example, are in consoles of motor vehicles, dishwashers, washing machines, telephones, or the like. Touch modules and operating element modules are interconnected by the layout of conductors in the form of a geometrically distorted electrical matrix on a single plastic film which forms a carrier for a combined input device. The conductors are electrically insulated from each other, but capacitively coupled to crossover points in the electrical matrix, the crossover points dividing the matrix into at least two areas. Strip conductors extend from the matrix at an edge area of the matrix of the touch module and connected to the operating elements forming a geometrically distorted matrix of conductors on the plastic film.

24 Claims, 3 Drawing Sheets

(51) Int. Cl.
*H05K 3/32* (2006.01)
*H05K 1/02* (2006.01)

(52) U.S. Cl.
CPC .. *G06F 2203/04112* (2013.01); *H05K 1/0274* (2013.01); *Y10T 29/4913* (2015.01)

(56) References Cited

U.S. PATENT DOCUMENTS

| | | | |
|---|---|---|---|
| 4,879,508 | A | 11/1989 | Andermo |
| 5,034,740 | A | 7/1991 | Acher |
| 6,222,522 | B1 | 4/2001 | Mathews et al. |
| 7,466,307 | B2 | 12/2008 | Trent, Jr. et al. |
| 8,586,874 | B2 | 11/2013 | Kuriki |
| 9,018,536 | B2 | 4/2015 | Ullmann et al. |
| 2004/0095336 | A1 | 5/2004 | Hong et al. |
| 2006/0097991 | A1 | 5/2006 | Hotelling et al. |
| 2006/0197750 | A1* | 9/2006 | Kerr .............. G06F 1/1626 345/173 |
| 2007/0063987 | A1 | 3/2007 | Sato et al. |
| 2007/0165006 | A1 | 7/2007 | Sato et al. |
| 2007/0273659 | A1 | 11/2007 | XiaoPing |
| 2008/0032070 | A1 | 2/2008 | Hirschfelder et al. |
| 2008/0048978 | A1* | 2/2008 | Trent, Jr. .......... G06F 3/03547 345/157 |
| 2008/0095992 | A1 | 4/2008 | Hirschfelder et al. |
| 2009/0073135 | A1 | 3/2009 | Lin et al. |
| 2009/0146970 | A1* | 6/2009 | Lowles ............... G06F 3/044 345/174 |
| 2009/0267903 | A1 | 10/2009 | Cady et al. |
| 2010/0123670 | A1* | 5/2010 | Philipp ............... G06F 3/044 345/173 |
| 2010/0284132 | A1* | 11/2010 | Yi ................. B29C 45/14467 361/679.01 |
| 2010/0302201 | A1* | 12/2010 | Ritter ................. G06F 3/044 345/174 |
| 2011/0022351 | A1 | 1/2011 | Philipp et al. |
| 2011/0181545 | A1 | 7/2011 | Takahashi et al. |
| 2012/0038082 | A1 | 2/2012 | Burger et al. |
| 2012/0094090 | A1 | 4/2012 | Yamazaki et al. |
| 2012/0193130 | A1 | 8/2012 | Fix et al. |
| 2012/0273336 | A1 | 11/2012 | Kuriki |
| 2014/0166464 | A1 | 6/2014 | Fix et al. |
| 2014/0202840 | A1 | 7/2014 | Fix et al. |

FOREIGN PATENT DOCUMENTS

| | | |
|---|---|---|
| DE | 30 04461 A1 | 8/1981 |
| DE | 3149722 A1 | 9/1982 |
| DE | 8812393.6 U1 | 11/1988 |
| DE | 10221482 C1 | 9/2003 |
| DE | 10 2004 041867 A1 | 3/2006 |
| DE | 102004041868 B3 | 6/2006 |
| DE | 102005041114 A1 | 3/2007 |
| DE | 202006014244 U1 | 3/2007 |
| DE | 20 2006 018448 | 4/2007 |
| DE | 202007007345 | 12/2007 |
| DE | 102009013065 A1 | 9/2010 |
| DE | 20 2009 017952 U1 | 10/2010 |
| DE | 102009014757 A1 | 10/2010 |
| DE | 102009058138 A1 | 6/2011 |
| EP | 1501690 B1 | 2/2005 |
| EP | 2045698 A2 | 4/2009 |
| EP | 2065794 A1 | 6/2009 |
| EP | 2275908 A1 | 1/2011 |
| GB | 2090979 A | 7/1982 |
| GB | 2439614 B | 12/2008 |
| GB | 2469386 B | 10/2010 |
| JP | H02-001263 | 1/1990 |
| JP | H10-312715 | 11/1998 |
| JP | 2011-129112 A | 6/2011 |
| RU | 2029353 | 2/1995 |
| RU | 61899 U1 | 3/2007 |
| WO | WO2011/001961 A1 | 1/2011 |

\* cited by examiner

PLASTIC FILM HAVING LINES FOR A MULTI-MODAL INPUT DEVICE AND METHOD FOR PRODUCING

The invention relates to a plastic film for a multi-modal input device, in particular one that links a touch module and an operating element. For example, such input devices are found in the central consoles of motor vehicles, in dishwashers or washing machines, telephones or the like. In addition, the invention relates to the use of the plastic film to produce the multi-modal input device, as well as a method for producing a multi-modal input device.

Input devices are known which are constructed of two parts, wherein a first part comprises a touch module and a second part comprises an operating element such as a controller (slider) and/or control buttons or rotors. As a rule, the first part of the input device with touch module is based on a transparent, but inflexible carrier, because a matrix of strip conductors for the touch module is transparent, and as a rule this transparency is only achieved by conductive ITO (indium tin oxide) substrates.

The second part of the input device, comprising for example controllers and/or buttons, on the other hand, can be constructed on a flexible carrier, as transparency is not absolutely necessary here.

The costs are disadvantageous in the known input devices with at least two parts, because each touch module and each operating element module require individual connectors and further electronics, such as an individual evaluation circuit or controller.

An object of the present invention is therefore to overcome the disadvantages of the state of the art and reduce the costs of an input device comprising at least one touch module and one operating element.

The solution to this problem and the subject of the invention are disclosed in the following description, the figures and the claims.

A subject of the invention is therefore a plastic film having conductors, arranged on it, that are electrically insulated from each other, but are capacitively coupled to crossover points, and which form either vertically and/or laterally crossover points of an electrical matrix, wherein the crossover points forming the matrix divide it into at least two areas: a first area in which the crossover points are transparent and form a homogeneous matrix and a second area in which the crossover points are arranged as desired on the plastic film, wherein all the conductors together form the electrical matrix which is powered via a connection. In addition, a subject of the invention is the use of the plastic film as a carrier for a two-part input device, comprising a touch module and an operating element module, which is connected to evaluation electronics with a common connector. Finally, a subject of the invention is a method for producing an input device, comprising a touch module and an operating element, wherein a plastic film obtains, by processing, a surface structure with integrated conductors which converge at a common connector.

According to a preferred embodiment example of the invention, each of the crossover points is uniquely addressable.

It is preferably provided that each of the conductors is capacitively coupled with each of the remaining conductors via at most one of the crossover points. Thus, for example, it can be provided that a conductor is capacitively coupled for example with five of the remaining conductors in each case via one of the crossover points and is not capacitively coupled via crossover points with four of the other conductors, for example if a 5×5 matrix is present. Furthermore, it is also possible here that the number of strip conductors with which a strip conductor is capacitively coupled by means of crossover points varies, or also that this is constant.

According to a preferred embodiment example of the invention, the connection has a large number of contact elements, wherein each of the contact elements is connected in each case to one of the conductors. The connection thus consists for example of ten contact elements which are connected in each case to one of the conductors, with the result that the plastic film has ten conductors that are electrically insulated from each other and which are capacitively coupled to the crossover points.

One or more first ones of the conductors here preferably connect only crossover points of the first area of the matrix to the respective contact element assigned to the respective conductor. Furthermore, it is also possible that one or more second ones of the conductors connect only crossover points of the second area of the matrix to the respective contact element of the connection assigned to the respective one of the conductors. Further advantages result hereby in the data processing of the signal provided by the plastic film via the connection.

Furthermore, it is advantageous if one or more third ones of the conductors connect both crossover points of the first area of the matrix and crossover points of the second area of the matrix to the respective contact element of the connection assigned to the respective conductor.

According to the invention, a geometrically distorted matrix structure of the conductors on the plastic film forms an infrastructure which secures the electrical connection of the modules applied to the plastic film, thus for example the touch module and the operating elements. The conductors of the first area of the homogeneous matrix are preferably made of transparent conductive areas which are not made of conductive material over the whole surface, but have networks of conductive material on a transparent film. These are known from DE 10 2009 014 757.8.

In the case of the geometrically distorted matrix structure there is a preferred embodiment in which the lines are connected in series and thereby enable a clear addressing of each crossover point. Again, it is particularly preferred that the clear addressing of the individual crossover points can be carried out in an x,y coordinates system, thus an x-, y-coordinate assignment is provided.

All conductors belonging to the matrix are bundled at an area of the plastic film which comprises the connector. The matrix is composed of at least two areas, it has a first and homogeneous area in which the crossover points are arranged regularly and a second area which is only part of the matrix on account of the electrical link, but in which the crossover points of the matrix are arranged as desired on the plastic film. This second area produces the electrical connection of the operating elements, optionally via the homogeneous matrix. Although a series connection is preferred, a parallel connection with the transparent first part of the homogeneous matrix can also be provided if it seems worthwhile in the respective operating element at a site, for example because it is not important whether the car radio is turned up or down from the steering wheel or from a control dial or by input on a touch panel.

Conductive areas, such as are found for example in capacitively designed touch modules, as well as strip conductors are also called conductors.

The electrically insulated conductors which are capacitively coupled to the crossover points are preferably interconnected and/or, in particular at the connection, connected such that the crossover points are uniquely addressable.

In the present case, electrical crossover points in which non-parallel conductors or conductive areas intersect are called "crossover points", wherein panels can be defined by the crossover points. The crossover points are formed by conductors that are electrically insulated from each other and are in each case capacitively connected or coupled to the crossover points, wherein the crossover points form either vertical and/or lateral crossover points of an electrical matrix.

The crossover points named here can, but need not necessarily, be able to be represented by a view "forming a cross". The crossover points can also be arranged for example in one plane, whereby a capacitive and single-layered touch sensor forms, and/or can be formed by conductors arranged in two planes, whereby they can actually be represented visually in top view "forming a cross", as shown in the figures.

In the embodiment in which the crossover points lie next to each other on one plane, these are electrically insulated from each other laterally from each other simply by the spacing on the plastic film, in order that no short circuits occur. The problem of how the conductors emanating from the crossover points lying next to each other are correctly sorted and brought together at the connector is solved for example by forming bridges outside the transparent and/or visible area. Through the bridges, it is achieved that only x- and y-conductors arrive in the connector area.

The crossover points which are formed by conductors arranged one on top of the other, thus vertically, at intervals are in principle separated from each other by an insulating layer, with the result that short circuits are prevented.

In particular, such conductors which can be produced according to DE 10 2009 014 757.8 are called "conductive areas" within the meaning of the present description. Networks of conductive material are applied to a transparent carrier such that the transparency for the human eye is preserved. Despite the thin, preferably smaller than 10 μm, in particular preferably smaller than 5 μm wide, conductive structures used which form the networks, an electrical conductivity is achieved which is comparable to that of ITO. The coverage of the transparent carrier with conductive material is preferably less than 20%, in particular preferably less than 10% and quite particularly preferably less than 5%.

To form the homogeneous matrix, the networks are preferably arranged such that no moiré effect occurs, thus no additional coarse grids appear visible for the eye due to interference as a result of superimposition of the fine networks. For this, for example the parallelism of the straight lines and/or the angles of the wavy lines in the network are interrupted.

According to an advantageous embodiment of the invention, the first area of the homogeneous matrix is transparent. For example this has a display placed behind it. In addition, the plastic film has for example still further areas which are not transparent and do not have a display placed behind them.

Even outside the area of the homogeneous matrix, the plastic film can be transparent and/or have a display placed behind it, for example in order that illumination effects or LED displays can be used for the operating elements or as decoration around the operating elements.

For example buttons, controllers, rotors, so-called sliders, sliding buttons, sticks, mice or similar input modules are called operating elements. In the operating elements a line, wired as a rule, leads to the module and further to the controller.

For example, a touchscreen and touchpad which can be capacitively designed for example depending on the type of construction are called a touch module. This list is not final and is only intended to name typical representatives. In the touch module, a technical device is controlled by touching a surface.

According to the invention, in the production process the strip conductors, conductors and/or conductive areas on the plastic film are prefabricated before the plastic film is covered with the touch or operating element modules.

According to a particularly advantageous method, all the conductors, thus the conductors that represent conductive areas and/or the conductors covering the whole surface, are produced on the plastic film at the same time. The coverage with conductive areas preferably does not limit the transparency of the flexible plastic film.

According to an additionally advantageous embodiment, all conductors and conductive areas on the plastic film are made of a single material, with the result that only one material is to be applied to the plastic film in the production here, in order that all the lines are laid.

The conductors, strip conductors and/or conductive areas can be made of any electrically conductive material, for example made of metal, e.g. silver, copper, gold, aluminum, and/or made of an alloy or a conductive paste, as well as made of another conductive substance, for example an organic compound with movable charge carriers such as polyaniline, polythiophene and others.

The plastic film is for example a polyethylene terephthalate (PET) film, but can also be a transparent or partially transparent other plastic film, for example a film made of a polyolefin such as polyethylene (PE), polypropylene (PP), polyvinyl chloride (PVC), polystyrene (PS), polyester (PE) and/or polycarbonate (PC).

The plastic film can furthermore additionally have all types of coatings and/or surface structures which can be produced by heating, printing, stamping and/or bending the surface of the plastic film.

Examples from the state of the art for processing plastic films, such as are used here for example, are described in the following documents, the content of which is hereby made part of the disclosure content of the present description: DE 10 2004 041 868 B3, DE 102 21 482 C2, DE 10 2009 013 065 A1; DE 10 2004 041 867 A1 and EP 1 501 690 A0. These published documents serve as examples for techniques according to which a plastic film used according to the invention can be treated before, during and/or after coverage with conductors and/or input modules.

Flexible plastic films have for example the advantage that they can be processed in a continuous process, for example they can be printable via a roll-to-roll method.

The coverage of the plastic film with strip conductors and/or conductive areas as well as with the modules can likewise be carried out according to the above-described method or carried out according to other techniques, such as for example conventional structuring methods.

For example, the plastic film can be covered with conductors or processed by being printed with conductive pastes, by in-mold labelling on a shaped part.

Likewise, the plastic film can be shaped by deep drawing or processed by stamping with or without subsequent use of a doctor blade on a substance, as well as by silk-screen printing.

In addition to the conductors and the transparent areas, the plastic film can also have decorative and/or simple functional surface structures.

For example, the plastic film can obtain a further surface structure, which displays functionalities and/or has optical properties, by back injection molding, as well as by printing, heating and/or stamping.

For example, the plastic film can be laminated onto a film body or plastic carrier or applied by back injection molding which has a decoration with one or more sheets on the opposite side. The decoration is preferably matched to the electrical functionality of the plastic film.

The plastic carrier can also be produced by injection molding and have decoration within an area bordered for example by an injection-molded seam and display a transparency, through which light-emitting elements become visible, within a further area not, or not completely, covered by the touch module. For example, articles for the automotive field which have an inlay decoration can also be produced by injection molding.

The area of the touchpad and/or the touchscreen can, for one thing, have a display placed behind it, but can also have other functions/properties. The area of the operating elements can also, for example in contrast to that with a display placed behind it, be non-transparent and have any surface structures at all and optical, haptic, sensory or other properties.

For example, the plastic film with the conductors can be applied by back injection molding to one side and a decoration layer to the other side of a shaped part or carrier. All the plastic parts which are decorated on the front can have an electrically functional plastic film according to the invention on the back and/or additionally on the front or on another side of the carrier. The electrically functional plastic film according to the invention can be connected to the carrier by laminating or back injection molding.

For the decoration of plastic parts, the in-mold decoration method is known which is characterized in that the injection molding and the decoration of the plastic part can be carried out in one work step. A plastic film according to the present invention can be applied and/or back injection molded according to these or other methods to a transparent carrier similarly to and preferably also at the same time as the decoration.

Examples from the state of the art for applying an electrically functional plastic film, such as are used here for example, are described in the following documents, the content of which is hereby made part of the disclosure content of the present description: DE 10 2004 041 868 B3, DE 102 21 482 C2, DE 10 2009 013 065 A1; DE 10 2004 041 867 A1 and EP 1 501 690 A0. These published documents serve as examples of techniques according to which an electrically functional plastic film used according to the invention can be applied to a transparent carrier and/or decorated together with the carrier.

The connector and/or connection electrodes are preferably also made of the same material as the conductors on the plastic film. In addition, they can also be constructed from different conductive materials, for example they can be made of copper or silver or another metal or an alloy.

The crossover points of conductive areas or conductors which form the electrical or a, for example the homogeneous, part of the matrix can be arranged on two different planes or also on one plane. The figure in top view which shows crosses is the embodiment of the invention in which the crossover points are formed by conductors which are electrically separated from each other in the vertical spacing relative to each other and by an insulating intermediate layer and are arranged capacitively coupled to the crossover points. It is preferred that this arrangement is chosen such that no moiré effect occurs.

The second type of electrical crossover points is that in which the crossover points are present separated from each other laterally and which lead to a touch sensor which can also be constructed of one layer.

The part of the matrix on the plastic film according to the invention which forms the homogeneous matrix is not limited according to the invention to the conventional matrix, constructed strictly horizontally and vertically, which is constructed of tracks arranged parallel to each other and rotated by an angle of 90°. In addition, further matrices come into consideration, for example simply the rhombus shape of the matrix or also meandering strip conductors which form crossover points or define panels. The matrix structure of the homogeneous partial section of the matrix is however suitable as a whole for serving as a substructure for a multi-touch sensor.

For this, the conductive areas of the homogeneous part of the matrix form a pattern of conductive areas that intersect and are arranged for example vertically spaced apart from each other, wherein the homogeneous matrix in top view defines crossover points and/or panels which are electrically readable, thus identifiable, when the touch module is operated.

The invention will be explained in more detail below with reference to figures which represent the state of the art (FIG. 1) and embodiment examples in accordance with innovations according to the invention (FIGS. 2 and 3):

Figure 1:
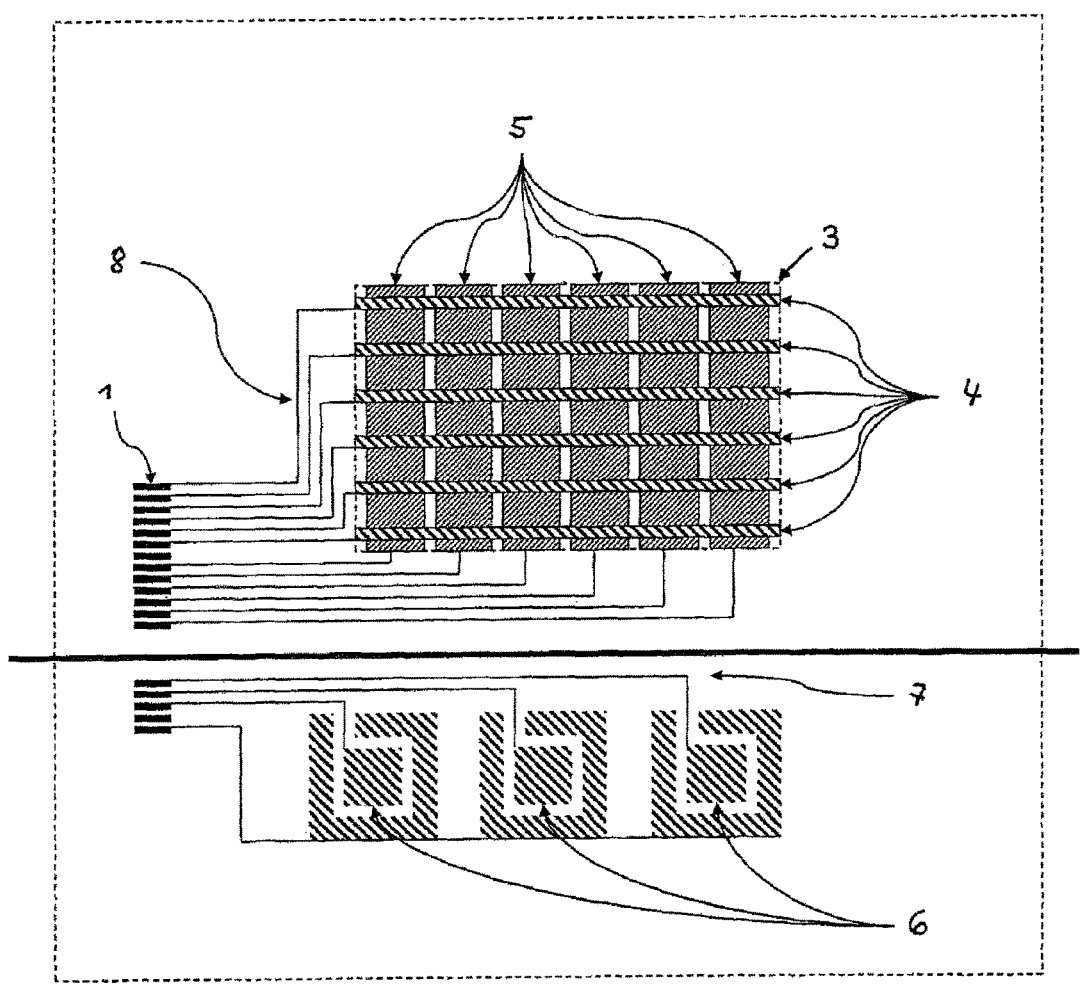
FIG. 1 shows the course of the conductive areas/conductors of a two-part input device with touch module and operating elements according to the state of the art in which the input device is manufactured on two substrates and is to be connected to two controllers by two connectors.

According to FIG. 1, it is shown how touchscreens or touchpads are connected to further elements, buttons, controllers, rotors according to the state of the art for example for central consoles in motor vehicles. The touchscreens or touchpads belong for example to navigation devices, mobile telephones and/or multimedia devices, the operating element input devices belong for example to window lifts, heaters or the like.

According to the embodiment shown here according to the state of the art, two different connectors 1 and 2 are used, wherein connector 1, shown at the top according to this exemplary arrangement, is connected to the touch module and connector 2 relays the control of the operating elements, shown at the bottom here by way of example. Touch module and operating elements can, naturally, also be arranged reversed or next to each other or partially intersecting.

The homogeneous matrix 3 for the touch module with conductive areas 4 and 5 which are arranged in rows and columns is recognizable at the top, wherein a non-transparent conductor 8 connects to the end of each row and each column here. All the conductors 8 converge in the connector 1. The conductive areas 4 and 5 are shown shaded, in order that the network structure of the conductive area preferred here can be distinguished from the structure over the whole surface of a conventional conductor.

In the lower area, three operating elements 6 are represented schematically which are connected to the connector 2 via conductors 7. The operating elements 6 can be transparent, non-transparent or partially transparent.

Figure 2:
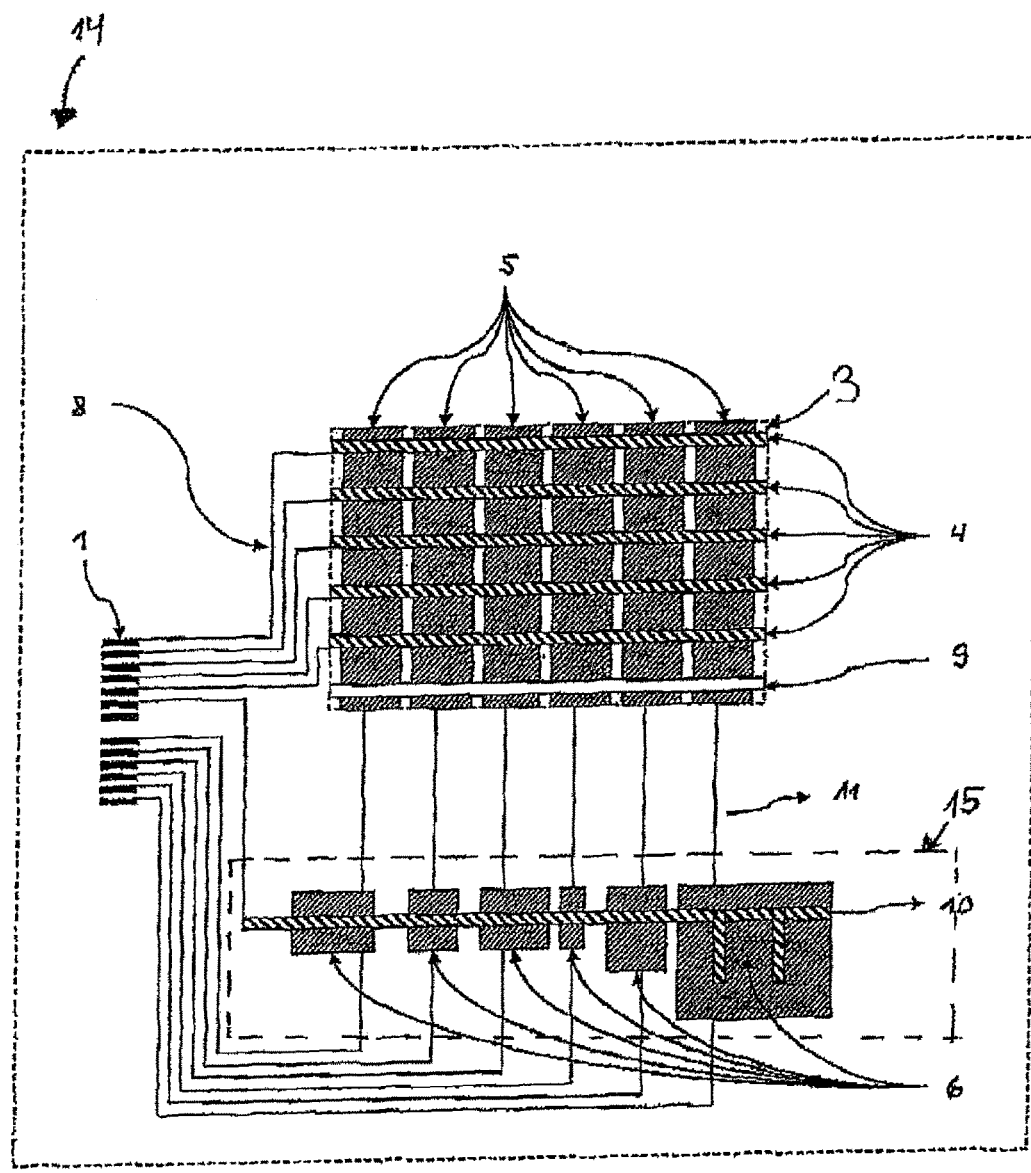
FIG. 2 shows the course of conductive areas and conductors according to an embodiment of the invention.

FIG. 2 shows the same view according to an embodiment according to the invention, wherein the conductors 7 which are not part of a matrix and the connector 2 are cut down on.

The plastic film 14 thus has a connection, namely the connector 1, and conductors that are electrically insulated from each other and connected to the connection 1 and which are formed in each case by a conductor structure which is composed of one or more of the non-transparent conductors 8 as well as the conductive areas 4, 5 and 6 and 10.

Thus, for example, the connection, namely the connector 1, consists of a large number of contact elements which are formed for example by strip-shaped, electrically conductive areas, such as shown for example in FIG. 2 for the connector 1. Each of these contact elements is connected to one of the conductors that are electrically insulated from each other. Thus, for example, one or more of the contact elements, five of the contact elements in the embodiment example according to FIG. 2, are connected to one of the conductive areas 4 via a respective non-transparent strip conductor 8, which areas are preferably in each case a transparent conductive area.

Furthermore, one or more of the contact elements, by way of example one of the contact elements in the embodiment example according to FIG. 2, are connected in each case to a conductive area 10, preferably connected to one of the conductive areas 10 via one of the non-transparent conductors 8.

Furthermore, one or more of the contact elements, six of the contact elements in the embodiment example according to FIG. 2, are connected in each case to one of the conductive areas 6 and one of the conductive areas 5, preferably—as shown in FIG. 2—connected to one of the conductive areas 6 via one of the non-transparent conductors 8 and to a conductive area 5 via a further one of the non-transparent conductors 8.

The electrically conductive areas 4 and 5 on the one hand and 10 and 6 on the other hand are provided electrically insulated from each other and overlap—as shown by way of example in FIG. 2—in areas, with the result that in the area of the overlaps crossover points are formed in which the conductive areas 4 and 5 and 10 and 6 respectively are in each case capacitively coupled to each other.

Preferably, each of the contact elements of the connection here is capacitively coupled to each of the remaining contact elements of the connection at most via one of the crossover points. For example, the upper six contact elements of the connection according to FIG. 2 are capacitively coupled in each case to one of the lower five contact elements in each case via one crossover point.

Here, on a single carrier, the—preferably transparent—plastic film 14, the matrix structure 3 of the intersecting conductive areas of the touch module is recognizable at the top and, at the bottom, the area 15 which shows one type of connection of the operating elements according to the invention to the electrical matrix. The matrix structure can be designed compact and flat, thus with rows and columns within one plane, or less compact, thus two-layered with layers arranged one on top of the other and spaced apart from each other made of conductive areas 4 and 5 as well as 10 and 6 which are separated from each other via an insulating layer.

In FIG. 2, in contrast to FIG. 1, the lowest row 4 is absent as part of the homogeneous matrix 3. The electrical connection of these crossover points takes place according to this embodiment via the operating elements 6. For simpler comparison of the invention according to FIG. 2 with the state of the art shown in FIG. 1, the site of the homogeneous matrix 3 without conductors is labelled 9. It can be recognized that a distorted matrix is formed, wherein in the embodiment shown the number of conductors which are assigned to a crossover point remains the same due to the distortion. The crossover points of the distorted matrix in this embodiment are either a constituent of the homogeneous and transparent matrix or are arranged as desired on the plastic film.

The lowest row 4 of the homogeneous matrix 3 is swapped out according to FIG. 2 and forms crossover points of conductors 10 of the electrical matrix in the operating elements 6. A conductor 11 connects in each case the homogeneous matrix 3 to the crossover points in the operating elements 6. Thus, although the matrix is geometrically distorted, it is electrically retained.

The conductor 8 of the lowest row of the matrix is used correspondingly for the operating elements 6. The remaining conductors 8 for the rows of the homogeneous matrix 3 do not change their function and they detect the touch module inputs. The input elements 6 can also be combined partially into a slider.

Figure 3:
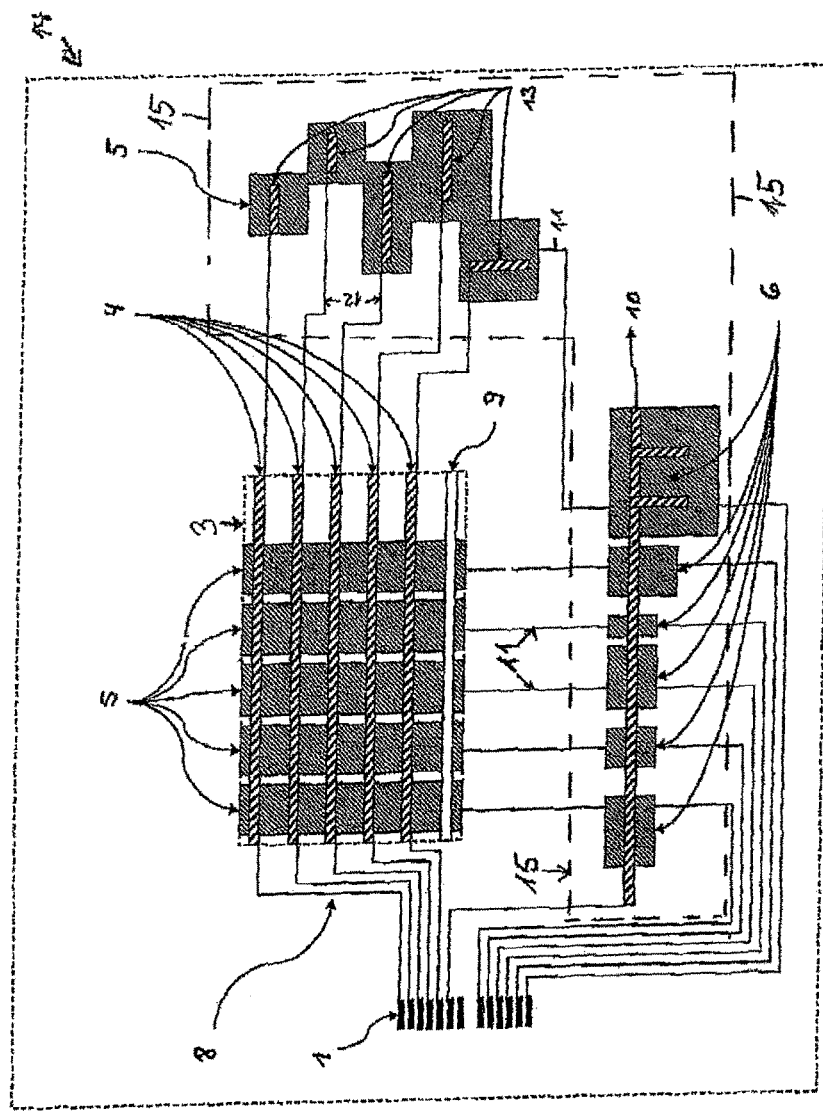
FIG. 3 shows the course of conductive areas and conductors according to another embodiment of the invention.

FIG. 3 also shows the same view as the two previous FIGS. 1 and 2, but according to a further embodiment example according to the invention. Largely the same structure as was shown in FIG. 2 is recognizable, but there is a further geometrical distortion of the electrical matrix forming the basis and thus a broadened area 15 which is shown by a dotted line and runs around the corner according to FIG. 3. Thus, further to the right in the image, the swapping-out of a column of the homogeneous matrix 3 is also recognizable, which is connected by conductors 12, just like the conductors of the "swapped out" row to the homogeneous matrix 3 at the bottom by conductors 11. The swapping-out of a column can be arranged in any form just like the swapped out row, for example the operating elements 13 of the swapped out column could also be arranged in the form of a circle, whereby a rotor function would form.

For the geometric distortion diagonally to that shown here, thus the swapping-out of first rows or first columns, ZIF connection assemblies can be used for example.

Furthermore, any number of touch modules with any number of operating elements can also be arranged on a plastic film in any layout.

For example, a CIV connector and/or zero injection force connector are used as connector.

The invention solves the problem of the costs of two connectors for two-part input devices with a touch module and operating elements. By introducing flexible transparent conductive layers, such as are known from DE 10 2009 014 757.8, transparent areas of touch modules can be produced, just like the areas of the operating elements, flexible and on a plastic film.

The invention shows, for the first time, how touch modules on the one hand and operating element modules on the other hand can be connected by means of the layout of the conductors in the form of a geometrically distorted matrix on a single plastic film which forms a carrier for a combined input device. For this, strip conductors are swapped out in the edge area of the strip conductor matrix of the touch module and connected to the operating elements. Thus, a geometrically distorted matrix of conductors which can all be produced in one work step forms on the plastic film.

The invention claimed is:

1. A plastic film arrangement comprising:
   a plastic film;
   a touch module on the film comprising a plurality of conductors arranged in a coordinate system, the conductors being electrically insulated from each other, but capacitively coupled to crossover points forming a first matrix of conductors, and which points are located relative to one another either vertically and/or laterally or radially in the coordinate system; and
   an operating module on the film comprising further conductors forming a second matrix of conductors, the first and second matrix of conductors being combined to form a third matrix of conductors comprising the coordinate system, the operating module second matrix of conductors being electrically insulated from each other, but capacitively coupled to further crossover points in the second matrix, which first and second matrices of conductors are so connected to enable addressing of each crossover point from a corresponding conductor power source via a common connection;
   wherein the crossover points forming the third matrix are so located such that they divide the third matrix into at least two areas: a first area forming the touch module in which the crossover points are transparent and form the first matrix, which serves as a substructure for a multi-touch sensor and a second area forming the operating module in which the crossover points are arranged such that the third matrix is geometrically distorted in that a conductor is swapped out of the first matrix and which swapped out conductor is functionally replaced by a conductor in the second matrix; and wherein the conductors associated with the crossover points are electrically retained, wherein all of the conductors which form the third matrix are powered via the common connection.

2. The plastic film arrangement according to claim 1, wherein the conductors in the transparent area form conductive areas comprising networks of conductive tracks with a width smaller than/equal to 20 μm, wherein the conductive tracks are spaced apart from each other such that the networks appear transparent.

3. The plastic film arrangement according to claim 1 wherein all conductors on the plastic film are of the same conductive material.

4. The plastic film arrangement according to claim 1, wherein the touch module matrix forms a plurality of networks, the conductive tracks being located inside the networks such that they exhibit a periodicity that is interrupted, wherein either the relative angles to each other among the conductors are varied for parallel lines or the periodicity changes for wavy lines, with the result that when superimposed the networks display no moiré effect.

5. The plastic film arrangement according to claim 1 further including a carrier for the plastic film, wherein the coverage of the carrier by the film with conductive material within the conductive areas amounts to 20% of the carrier surface area or less.

6. The plastic film arrangement according to claim 1 wherein the transparent area has an overlying display.

7. The plastic film arrangement according to claim 1 including a transparent carrier for the plastic film and/or comprises a decoration layer having a decorated side.

8. The plastic film arrangement according to claim 7, wherein the plastic film and the decoration layer are applied to the same side and/or to different sides of the transparent carrier.

9. The plastic film arrangement according to claim 7 applied to one side of a transparent carrier and which comprises a decoration layer on the opposite side of the carrier, wherein the decoration layer is matched to the electrical functionality of the plastic film.

10. The plastic film arrangement according to claim 7 wherein the decoration layer comprises at least one sheet.

11. The plastic film arrangement according to claim 1 further including a protective layer over the film.

12. The plastic film arrangement according to claim 1 including further transparent areas, wherein light-emitting elements become visible through these further transparent areas.

13. The plastic film arrangement according to claim 1 wherein the electrically insulated conductors which are capacitively coupled to the crossover points are interconnected and/or connected such that the crossover points are uniquely addressable.

14. The plastic film arrangement according to claim 1 comprising an arrangement for capacitively coupling each of the conductors to each of the remaining conductors via at most one of the crossover points.

15. The plastic film arrangement according to claim 1 wherein the connection comprises a plurality of contact elements wherein each of the contact elements is connected to one of the conductors.

16. Plastic film arrangement according to claim 15, wherein at least a first one of the conductors connects only crossover points of the first area of the matrix to an assigned contact element of the connection and wherein at least one second conductor, different from this, connects only crossover points of the second area of the matrix to the assigned contact element of the connection.

17. The plastic film arrangement according to claim 16, wherein at least a third one of the conductors connects both at least one or more of the crossover points of the first area of the matrix and one or more of the crossover points of the second area of the matrix to the assigned contact element of the connection.

18. A method for producing a multimodal input device employing the plastic film arrangement of claim 1, comprising:
   forming the touch module and the operating module; and
   attaching electrical conductors bundled at a common connector to the plastic film for electrically coupling the touch module to the operating module.

19. The method according to claim 18, wherein the forming step comprises imprinting, heating, printing, stamping, bending and/or in-mold injection.

20. Method according to claim 18, wherein the plastic film arrangement is applied to a carrier and/or processed by injection molding, in-mold injection and/or back injection molding, deep drawing and/or by a transfer film.

21. Method according to claim 18, wherein the plastic film arrangement is laminated on to a carrier or applied by back injection molding, which carrier has a decoration comprising one or more sheets located on the opposite side of the carrier from which the film is located.

22. Method according to claim 21, wherein the plastic film arrangement has at least one electrical functionality and the decoration is matched to the electrical functionality of the plastic film, with the result that a homogeneous matrix of the plastic film is in an area of the carrier, where the decoration is transparent.

23. Method according to claim 18, wherein the plastic film arrangement is covered with a protective film.

24. The plastic film arrangement according to claim 1 wherein the film is a substrate of a two-part input device, comprising at least one touch module and at least one operating element, which touch module and operating element are connected to evaluation electronics via a common connector.

* * * * *